United States Patent
Lanzagorta-Saldana

(10) Patent No.: US 8,054,070 B1
(45) Date of Patent: Nov. 8, 2011

(54) NANOMAGNET-BASED MAGNETIC ANOMALY DETECTOR

(75) Inventor: Mario Octavio Lanzagorta-Saldana, Alexandria, VA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 363 days.

(21) Appl. No.: 12/328,065

(22) Filed: Dec. 4, 2008

(51) Int. Cl.
  *G01R 33/02* (2006.01)
  *G01R 33/00* (2006.01)
  *G01V 3/06* (2006.01)

(52) U.S. Cl. ............... 324/244; 324/260; 324/365

(58) Field of Classification Search ........ 324/244–260, 324/344, 345, 365; 702/2, 5, 16
  See application file for complete search history.

(56) References Cited

U.S. PATENT DOCUMENTS

| | | | | |
|---|---|---|---|---|
| 5,443,027 | A * | 8/1995 | Owsley et al. | 114/244 |
| 6,031,377 | A * | 2/2000 | Watkins | 324/345 |
| 6,828,786 | B2 * | 12/2004 | Scherer et al. | 324/300 |
| 7,190,634 | B2 * | 3/2007 | Lambert et al. | 367/128 |
| 7,206,254 | B2 * | 4/2007 | Oliver et al. | 367/20 |
| 7,355,822 | B2 * | 4/2008 | Daughton et al. | 360/324 |
| 7,450,467 | B2 * | 11/2008 | Tveide et al. | 367/16 |
| 7,705,599 | B2 * | 4/2010 | Strack et al. | 324/348 |
| 2004/0073373 | A1 * | 4/2004 | Wilson | 702/16 |
| 2009/0141587 | A1 * | 6/2009 | Welker et al. | 367/16 |
| 2010/0225324 | A1 * | 9/2010 | Strack et al. | 324/365 |

OTHER PUBLICATIONS

Baruah, T. et al., "Understanding the electronic structure, optical, and vibrational properties of the $Fe_8BR_8$ single-molecule magnet," Physical Review B, 70, pp. 214410-1-9, 2004.
Baruah, T. et al., "Density functional study on a light harvesting carotenoid-porphyin-$C_{60}$ molecular triad," Naval Research Laboratory, Washington, D.C., Sep. 12, 2005, 5 pages.
Maeda, K. et al., "Chemical compass model of avian magnetoreception," Nature 06834, vol. 453, May 15, 2008, pp. 387-391.

* cited by examiner

*Primary Examiner* — Huy Q Phan
*Assistant Examiner* — Joshua Benitez
(74) *Attorney, Agent, or Firm* — Edell, Shapiro & Finnan, LLC

(57) ABSTRACT

A field distributed array of a plurality of underwater sensors are used to detect, preferably using a nanomagnet, slight changes in magnetic fields caused by passing metallic structures, such as submarines. Each sensor is preferably configured to communicate with, e.g., an Unmanned Underwater Vehicle (UUV), which then passes raw or aggregated information to a user (person or computing device). In one possible embodiment, an aircraft deploys hundreds of sensors on the "battlefield" (i.e., in the ocean). Some of the sensors are controlled to sink and anchor to the bottom, while others are controlled to float at a predetermined depth, from which they transmit data about their magnetic environs, such that a map of the geomagnetic field in the area can be generated. This type of distributed sensor system is particularly effective for antisubmarine warfare (ASW) operations across a wide area of a zone of operations.

26 Claims, 3 Drawing Sheets

NANOMAGNET-BASED MAGNETIC ANOMALY DETECTOR

FIELD OF THE INVENTION

Embodiments of the present invention are related to Magnetic Anomaly Detection (MAD) devices and the use thereof.

BACKGROUND OF THE INVENTION

It is of great importance to be able to detect sub-surface vessels such as submarines. One detection method includes monitoring changes in the magnetic field of a given area. That is, as a submarine moves, it alters the magnitude and direction of Earth's natural geomagnetic field. Although these changes to the geomagnetic field are very small, they are detectable by high precision magnetometers. The use of magnetometers to detect enemy vessels in Anti-Submarine Warfare (ASW) operations is known as Magnetic Anomaly Detection (MAD), and this is a technique that has been widely used by the world's navies since the days of World War II.

MAD for ASW is usually performed by mounting a high precision magnetometer on the tail of an aircraft, helicopter, or Unmanned Aerial Vehicle (UAV). The aircraft traverses an area of interest measuring the magnetic field. These measurements are compared to established geomagnetic records. Any magnetic deviation to the established geomagnetic field of the area is then interpreted as the potential presence of an adversary submarine.

Alternatively, MAD for harbor protection is accomplished by mounting magnetometers on buoys that surround the area of interest. These buoys float on the surface and transmit their measurements to some location that performs data fusion to determine if enemy vessels are disturbing the geomagnetic field of the area.

Even though ASW and harbor protection are defensive operations, MAD can be used for offensive operations such as mine warfare. In this case, magnetometers are installed on the mines, and a given mine is triggered if its associated sensor detects substantial deviations to the geomagnetic field.

The vast majority of ASW operations are aircraft based. However, there are several shortcomings to the use of MAD sensors for aircraft mounted ASW operations:
  i. As the magnetometer is usually mounted on the tail of an aircraft, it is subject to a large amount of noise due to the magnetic anomaly produced by the aircraft itself.
  ii. This approach only works when the distance between the magnetometer/aircraft and the submarine is not too large (the aircraft has to fly at very low altitude and the target submarine has to travel at a shallow depth). However, most of the threat to, e.g., an aircraft carrier group, comes from submarines operating at substantial depths.
  iii. MAD over an extended area of interest necessitates that the aircraft fly a swathing path that covers a large grid. This technique does not guarantee a successful detection of the submarine, as the enemy vessel may be fortunate to traverse the area when the aircraft is in a different region.
  iv. Each littoral area has its own, often time-dependent, magnetic field topography defined by naturally occurring metallic materials, along with man-made metallic materials such as port infrastructure and sunken debris. As such, it is difficult to keep an up to date geomagnetic map of the entire globe.
  v. The magnetic field surrounding a carrier group is complex, and imposes a challenge to determine the unperturbed magnetic configuration to establish the presence of an enemy vessel.

Some disadvantages for the use of MAD for harbor protection include the fact that buoys are big, bulky, and relatively expensive. Therefore, it is extremely difficult, time consuming, and expensive to deploy them. In the case where an operation has to be mounted in an obscure part of the world, the use of big buoys is not an efficient solution.

Finally, some common disadvantages for the use of MAD for ASW, harbor defense, and mine warfare are:
  i. High precision magnetometers are big and bulky.
  ii. High precision magnetometers are expensive.
  iii. High precision magnetometers have considerable power requirements.
  iv. Some high precision magnetometers have operational restrictions regarding temperature and humidity.
  v. High precision magnetometers are difficult to ruggedize for the undersea combat environment.
  vi. High precision magnetometers are complex to mass produce on a timely manner.
  vii. Most of the highest precision magnetometers available are scalar detectors, in the sense that they can detect the magnitude of the magnetic field, but not its direction.
  viii. Some of the highest precision magnetometers currently available, such as those based on Superconducting Quantum Interference Devices (SQUID), require cryogenic needs. As such, their ruggedization for the battlefield environment is extremely difficult.

In light of the foregoing, there is a need for a different approach to ASW operations, among other types of operations.

SUMMARY OF THE INVENTION

Embodiments of the present invention provide a NanOmagnet-based Magnetic Anomaly Detector (NOMAD) sensor to conduct Magnetic Anomaly Detection (MAD). Each NOMAD sensor preferably incorporates a high precision nanomagnet as a magnetometer inside a convenient modular design. Besides the nanomagnet-based magnetometer, each sensor may incorporate a communications unit with a unique identifier, a buoyancy/anchor unit, and a control unit. These sensors are characterized by their high precision, small size, low unit cost, and negligible power requirements. In addition, these magnetometers, by virtue of their size and other characteristics, can be ruggedized relatively easily as compared to prior art devices. Moreover, NOMAD sensors in accordance with embodiments of the present invention are vector magnetometers, in that they are able to measure both the intensity and the direction of a given magnetic field.

In a particular embodiment of the present invention, a field distributed array of NOMAD sensors are used to assist ASW operations across a wide area of a zone of operations. For instance, an aircraft can deploy hundreds of NOMAD sensors on the battlefield. Some of these sensors may be controlled to sink and anchor to the bottom, while others may be controlled to float at a pre-determined depth. The sensors may also communicate with an Unmanned Underwater Vehicle (UUV), which collects data from respective sensors and fuses that data to form a map of the geomagnetic field in the area. Any disturbance thereafter detected can be reported as the potential presence of an enemy vessel. This ASW approach provides an array of unattended sensors that offers continuous surveillance of an undersea environment at arbitrary depths and oceanic zones. As such, NOMAD sensors address many, if not all, of the above-mentioned disadvantages of traditional MAD methods.

These and other features of the several embodiments of the invention along with their attendant advantages will be more fully appreciated upon a reading of the following detailed description in conjunction with the associated drawings.

DETAILED DESCRIPTION

As noted, an embodiment of the present invention provides a field distributed array of a plurality of underwater sensors that are used to detect slight changes in magnetic fields caused by passing metallic structures, such as submarines. Each sensor preferably is configured to communicate with a central processing location, directly, or through an intermediary such as an Unmanned Underwater Vehicle (UUV), which then passes raw or aggregated information to a user (person or computing device). This type of distributed sensor system is particularly effective for antisubmarine warfare (ASW) operations across a wide area of a zone of operations. In one possible embodiment, an aircraft deploys hundreds of sensors on the "battlefield" (i.e., in the ocean). Some of the sensors are designed to sink and anchor to the bottom, while others are designed to float at a pre-determined or controllable depth, from which they transmit data about their environs, such that a map of the geomagnetic field in the area can be generated.

Figure 1:
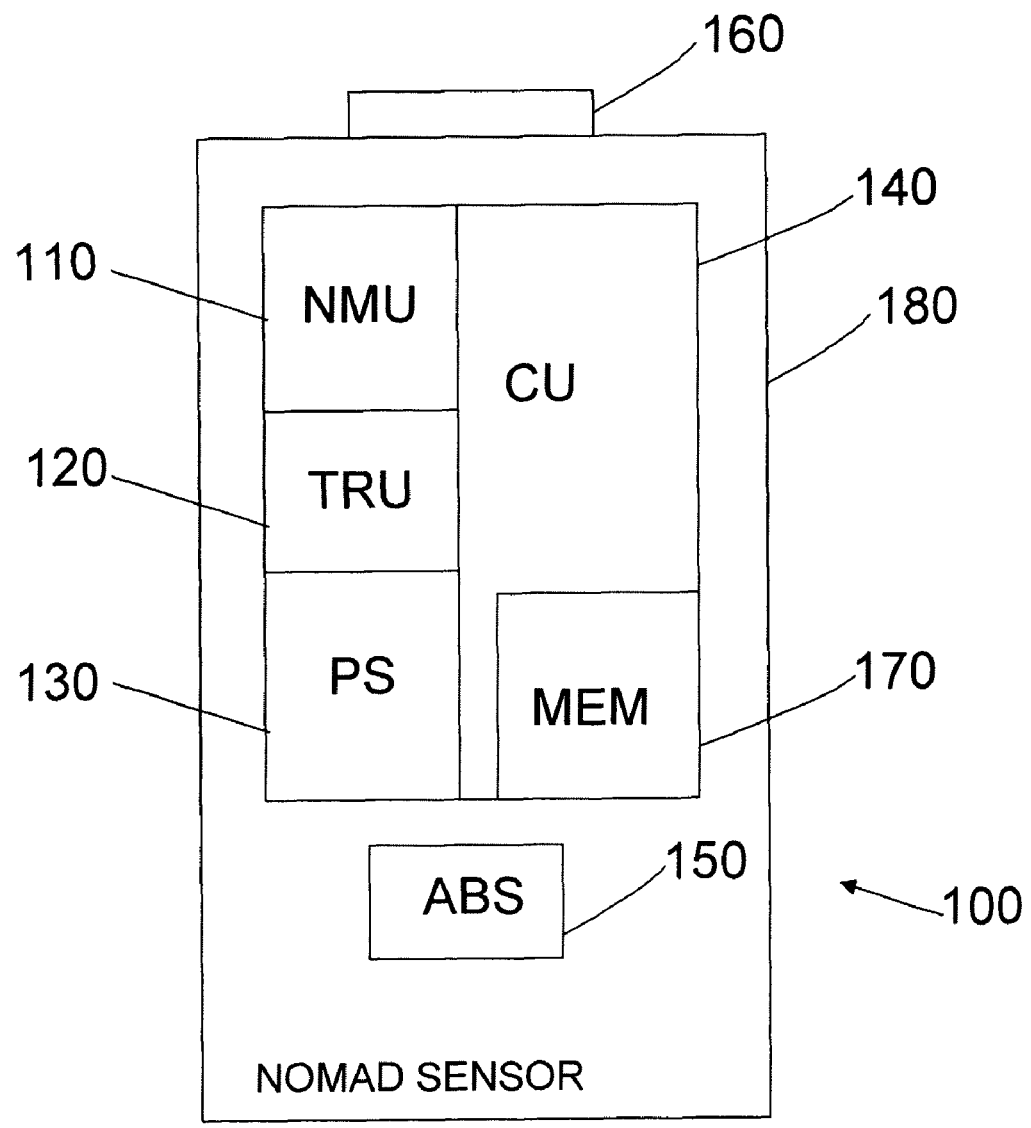
FIG. 1 depicts a schematic diagram of a NOMAD sensor in accordance with an embodiment of the present invention.

More specifically, FIG. 1 depicts a schematic diagram of a NOMAD sensor 100 in accordance with an embodiment of the present invention. Each NOMAD sensor 100 preferably comprises a nanomagnet-based magnetometer unit (NMU) 110, a transmitter/receiver unit (TRU) 120, which communicates with a distinct identifier; a compact power source (PS) 130, e.g., a rechargeable battery, a control unit (CU) 140, and an anchor/automated buoyancy system (ABS) 150. The NOMAD sensor is preferably enclosed within a ruggedized enclosure 180, which may be plastic, metal, ceramic, or any other suitable material.

The magnetic sensor portion of NMU 110 is preferably comprised of molecular structures that behave as superparamagnets. While there are many nanomagnets with different characteristics, NOMAD sensor 100 preferably operates with a biologically inspired molecular triad, described, for example, in Maeda et al., *Chemical compass model of avian magnetoreception*, Nature, Vol. 453, May 15, 2008, which is incorporated herein by reference. NMU 110 can also be implemented with any other nanomagnet that satisfies operational functionality, as described later herein. One implementation of NMU 110 may be accomplished using the following single molecule magnet:

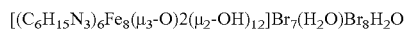

A full discussion of the characteristics of such a magnetic material can be found in Baruah et al., *Understanding the electronic structure, and vibrational properties of the $Fe_8Br_8$ single-molecule magnet*, Physical review B 70 214410 (2004) (The American Physical Society), which is also incorporated herein by reference. This molecular triad is relevant because it has been observed that low energy radiation, such as that coming from sunlight, lasers, or light-emitting diodes, transforms the molecular triad into a weak nanomagnet.

The lifetime of such excited nanomagnets has been shown to detect weak magnetic fields, much smaller than 50 micro-Teslas. However, it is believed that these materials can detect magnetic fields in the nano-Tesla or pico-Tesla scales. Low energy excitation of this type of nanomagnet, through biasing or proper choice of dielectric environment, enables these nanomagnets not only to provide increased field strength/sensitivity, but also to provide an indication of the direction of a given magnetic field. That is, magnetic field detection using these materials yields both a scalar value and a direction value. In other words, a vector indicative of the magnetic field can be obtained as an output of an appropriate magnetoelectric circuit. To provide a qualitative appreciation of the sensitivity of these molecular compounds, it is conjectured that these types of materials/compounds are used as bio-navigation systems by some migratory avian species.

Figure 2:
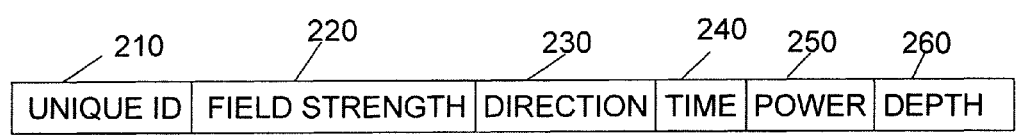
FIG. 2 depicts an example set of data that may be transmitted from a NOMAD sensor in accordance with an embodiment of the present invention.

Precision detection of the field strength and direction of a given magnetic field or magnetic anomaly is one aspect of an embodiment of the present invention. This magnetic field strength and magnetic field direction (referred to also as "NOMAD sensor data 200") is then preferably communicated to a separate location for processing. In accordance with an embodiment of the present invention, a TRU 120 is incorporated into each NOMAD sensor 100 and includes a unique identifier and a means for emitting a distinct signal that communicates the NOMAD sensor data 200. FIG. 2 depicts an example set of NOMAD sensor data 200 that may be transmitted from a NOMAD sensor in accordance with an embodiment of the present invention. Specifically, a unique ID 210 is provided together or separately with each (or any one or selected group) of the magnetic field strength 220, direction 230, a timestamp 240, and an indication of remaining (battery) power 250, sensor depth 260, among other possible variables, including, e.g., compass reading, orientation based on, e.g. a bubble tube.

Figure 3:
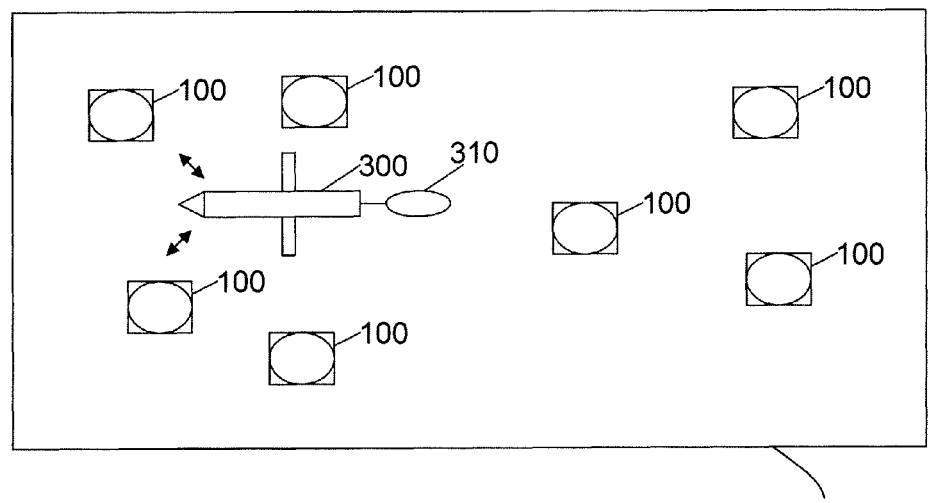
FIG. 3 illustrates, in plan view, a plurality of distributed NOMAD sensors, along with a UUV, in accordance with an embodiment of the invention.

As shown in FIG. 3, a beam-forming UUV 300 with, e.g., a global positioning system (GPS) mast (not shown) and a sonar towed array 310 uses the NOMAD sensor data 200 from each of the NOMAD sensors 100 to localize the position of all sensors and read their telemetry. A synchronization signal can be employed by the UUV to trigger sensor communications. Thus, time delays following the synchronization signal can be used to determine range to sensors for additional localization information.

The communication system can work with acoustic or electromagnetic signals, depending on the specific mission of the NOMAD sensors 100. For instance, acoustic communications are relatively easy to accomplish and can be used in defensive operations. That is, even if the adversary can hear a "busy" flow of (possibly encrypted) communications between the NOMAD sensors 100 and the UUV 300, the system may discourage enemy vessels from approaching their zone of operations. On the other hand, for an offensive operation that requires stealthy communications, the NOMAD sensors could, instead, rely on electromagnetic communications using a broadband to hide the information flow.

There are several challenges in underwater acoustic communications. For instance, limited bandwidth and signal dispersion in time and frequency, transmission losses by energy spreading and sound absorption, signal distortion caused by reverberation and multipath propagation, time-varying and location-dependent channel characteristics, and random fluctuations due to the environment.

However, the use of advanced signal processing algorithms allows robust underwater acoustic communications in medium ranges of about 100 Km. Some of these techniques include interference suppression, waveform design, adaptive algorithms, error correction codes, data compression, adaptive Doppler compression, higher order signal constellations, as well as coherent and non-coherent signal modulation.

In any event, relatively long distance communications can be avoided by relying on UUV 300 that is configured to traverse the area of operations 320. The UUV 300 preferably travels fast enough to be able to communicate with all the NOMAD sensors 100 in a relatively short period of time, but slow enough to reduce acoustic effects such as carrier phase variation and motion-induced pulse compression and dilatation.

When stealth communications are required, NOMAD sensors 100 can be deployed with an electromagnetic communications system for TRU 120. Electromagnetic signals are severely limited in the underwater environment, but using broad spectrum signaling, the communications between the NOMAD sensors 100 may remain undetected by adversaries. This is a particularly important issue if the NOMAD sensors 100 are used atop proximity mines.

PS 130 provides power to the several components integrated into each NOMAD sensor 100. Preferably, PS 130 includes rechargeable batteries and appropriate conditioning circuitry to provide the necessary electrical power to the several components of the NOMAD sensor 100.

CU 140 can be any appropriate microprocessor, application specific integrated circuit (ASIC), or other device that can be configured to perform the functions described herein, e.g., operating to capture the NOMAD sensor data 200, optionally store the same in memory 170, and operate in concert with TRU 120 to transmit NOMAD sensor data 200 to UUV 300, or some other location. CU 140 is preferably also configured to control ABS 150, which controls the buoyancy of NOMAD sensor 100.

More specifically, ABS 150 can be used by NOMAD sensor 100 to position itself at different depths to maximize their proximity to a potential target. The depth of a given NOMAD sensor 100 may be controlled by, e.g., UUV 300 via TRU 120. That is, UUV 300 may send signals to NOMAD sensors 100 to control their depths to a predetermined value. In this way, an array of NOMAD sensors 100 can be left to drift with natural ocean currents and be controlled to be at different depths depending on their location at a given time. Of course, CU 140 could be used to control ABS such that the NOMAD sensor 100 sinks and anchors to the bottom of the ocean. In this mode, it is possible to obtain a fixed position of the NOMAD sensor 100 at the bottom of the sea.

As will be appreciated by those skilled in the art, NOMAD sensors 100 operating in collaboration with UUV 300 can produce a reliable baseline magnetic map that can then be used to detect intruders. If the magnetometers (as part of NMUs 110) in the sensors have a precision of about 1 nanoTesla, then each sensor would have a range of about 100 meters. Therefore, it would be necessary to deploy about 50 NOMAD sensors to cover a square mile.

Low power requirements for the NOMAD sensor 100 permit the device to remain operational for days at the time.

Furthermore, in a particular embodiment of the present invention, the operational life of the device can be extended significantly by adding a solar cell 160 (shown in FIG. 1) to the configuration. In this case, the NOMAD sensor can be programmed to surface automatically when the charge in PS 130 is below a predetermined threshold, or in response to a command received via TRU 120, and/or based on NOMAD sensor data 200 previously supplied. To avoid having all the devices recharging their batteries at the same time, this procedure may be coordinated by the UUV 300.

The specific use of the NOMAD sensors 100 described herein depends on the zone of operations. Different strategies are contemplated, depending on whether intended operations are to take place in a littoral zone or in blue water.

The strategy to follow for ASW operations in littoral areas is as follows:

1. An aircraft deploys hundreds of NOMAD sensors distributed over the area of interest.
2. The NOMAD sensors 100 sink and are anchored at the bottom.
3. The UUV 300 is deployed to traverse the area of interest and to listen for the transmissions from the NOMAD sensors 100.
4. The UUV 300 localizes the static position of the sensors and creates a static baseline magnetic map.
5. In one possible embodiment, the NOMAD sensors 100 transmit their magnetometer readings (NOMAD sensor data 200) only when they detect a fluctuation in the magnetic field (e.g., different from a baseline measurement from step 4 above). This way, unwanted magnetic perturbations created by the communication system can be suppressed.
6. Using an onboard computer, the UUV 300 fuses the information received from all the sensors and its own towed sonar array. The characteristics of the static baseline magnetic map of the area are used to classify and localize the presence of the target.
7. The UUV transmits to base in case of a positive detection.

The strategy for operations in blue water is similar to the one for littoral areas. However, in this case the NOMAD sensors 100 use their buoyancy system (ABS 150) to sink to specific depths. The UUV 300 coordinates the depth distribution according to their mission, in order to maximize their proximity to a potential target.

This blue water situation is more complex because of the drifting of the NOMAD sensors 100 makes them traverse regions with different magnetic fields. Also, the relative motion between the emitter and receiver implies more intensive signal processing of the communications. In this case the sensor fusion process is more intensive, but it is still possible to get a fix on a potential target. This is accomplished at the expense of more intense communications between the NOMAD sensors 100 and the UUV 300 or other central or common receiving device.

The advantages of using an array of NOMAD sensors 100 for ASW operations include the following:

1. Minimal noise due to self-inducted magnetic anomaly.
2. Ability to detect submarines at arbitrary depths.
3. For blue water operations, the depth of the individual sensors can be controlled to increase their density at a given depth.
4. The baseline magnetic maps can support ASW operations in complex and dynamic magnetic field environments such as littoral zones.

5. These sensors form an array of unattended systems that offer continuous surveillance of the underwater environment.
6. They are simple to deploy anytime and anywhere in the world.
7. The have low operational costs.
8. They are simple to integrate to existing ASW and other naval systems.
9. They can serve as a low cost testbed to experiment with field distributed arrays using more sophisticated sensors and applications.

Figure 4:
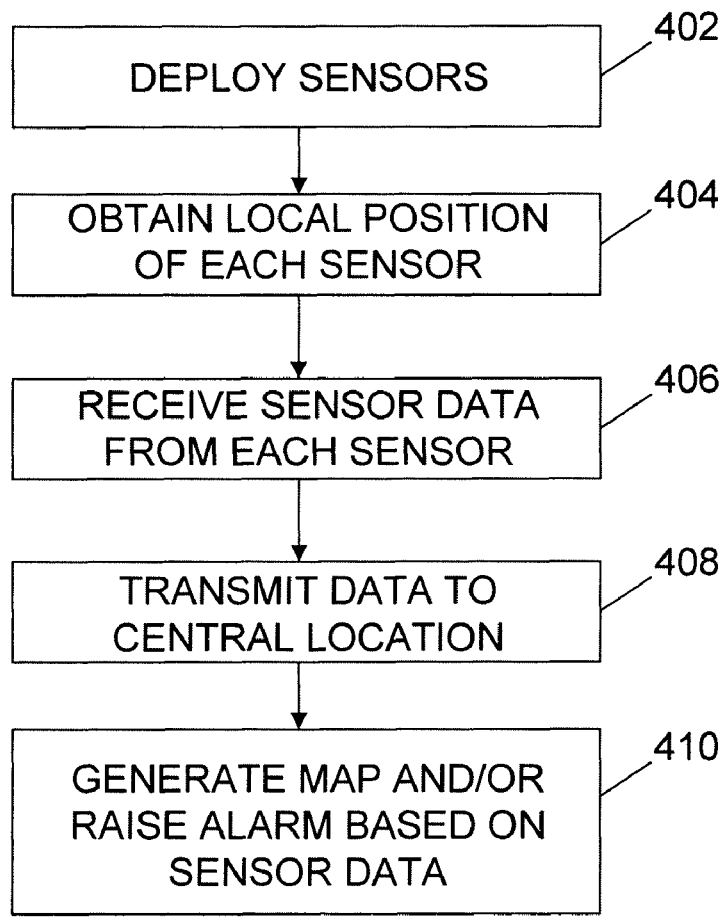
FIG. 4 shows an example of a process for deploying sensors and thereafter employing NOMAD sensors in accordance with an embodiment of the present invention.

FIG. 4 shows an example of a process for deploying sensors and employing the same to generate final magnetic anomaly results based on received data in accordance with an embodiment of the present invention. More specifically, at step 402 a plurality of NOMAD sensors 100 are deployed. These can be deployed by airplane as indicated to cover a large zone, or could simply be dropped by a passing ship or fleet of ships. In a preferred embodiment, the NOMAD sensors 100 are not active until placed in water. In this way, the battery remains fresh until the device goes into operational mode.

Figure 5:
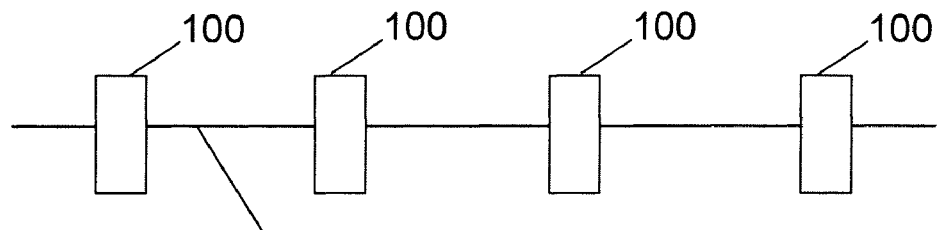
FIG. 5 shows a wired deployment option in accordance with an embodiment of the present invention.

Further, although not nearly as flexible of an implementation, each of the NOMAD sensors 100 can be connected, as shown in FIG. 5, to a cable 502 that acts to ensure that the devices 100 remain evenly spaced when deployed. This embodiment is more suited to littoral areas where a ship could lay the cable 502. Cable 502 could be an electrical/communications cable, which permits each of the devices 100 to communicate without having to acoustically or wirelessly transmit any data. Consequently, this embodiment improves stealth, but may be more complicated to deploy.

Referring again to FIG. 4, at step 404, the local position of each (or selected) NOMAD sensor 100 is obtained. This can be accomplished by having UUV 300 traverse the area in which the NOMAD sensors 100 were deployed and communicating with those sensors to obtain a range between a given sensor and the UUV 300, enabling the UUV 300 to compute, with the knowledge of the UUV's own position, using, e.g., GPS, an accurate position for each NOMAD sensor 300.

Thereafter, periodically, upon request, or upon detection of a change in a magnetic field, the UUV 300 receives data from NOMAD sensors, as indicated by step 406. This data can be in the form similar to that shown in FIG. 2, or any other convenient or appropriate format.

As shown, at step 408, the data received at the UUV 300 (or some other location such as a surface ship or submarine), is transmitted to a central location for data fusion. That is, the individual pieces information obtained from the each NOMAD sensor is aggregated and processed to generate a map of a magnetic field, as indicated in step 410. Optionally, an alarm can be raised if the processing results in a detected magnetic anomaly, indicative of a possible intruder. It is noted that steps 408 and 410 are shown separately, but aspects of these steps, as well as steps of other functions that may be related to one another, may be combined as appropriate for a given implementation.

The NOMAD sensors 100 described here are particularly suited for:
i. Anti-Submarine Warfare
ii. Protection of harbors and other littoral zones
iii. Mine warfare
iv. Carrier group defense As will be appreciated by those skilled in the art, several advantages are achieved with implementations of embodiments of the present invention, including, but not limited to:

1. High precision vector magnetometer. It is able to measure the magnitude and the direction of a magnetic field. It is sensitive to weak field variations in the nano-Tesla or pico-Tesla scale.
2. Light weight and very small size. Most of the size and weight are taken by the communication system and ruggedized enclosure.
3. Low unit cost.
4. Works across a wide range of environmental temperatures, and does not require cryogenic cooling, or heating system.
5. Small power requirements, as most of the power is consumed by the communications system.
6. It produces an insignificant magnetic disturbance in the magnetic field, much smaller to that produced by an aircraft.
7. Because of its simplicity, it is relatively simple to ruggedize for its operation in the undersea warfare environment.
8. Because of its simplicity, it is relatively simple to mass produce in a timely manner.

These characteristics of the NOMAD sensor 100 allow it to be part of an array of deployable field distributed sensors used to assist in ASW operations over a large combat zone, either littoral or blue water. Because they are inexpensive, small, and easy to mass produce, an aircraft can deploy hundreds of NOMAD sensors at the time, providing a system of unattended sensors that offer continuous surveillance of the undersea environment at arbitrary depths and oceanic zones across the globe.

The foregoing disclosure of embodiments of the present invention has been presented for purposes of illustration and description. It is not intended to be exhaustive or to limit the invention to the precise forms disclosed. Many variations and modifications of the embodiments described herein will be obvious to one of ordinary skill in the art in light of the above disclosure. The scope of the invention is to be defined only by the claims appended hereto, and by their equivalents.

What is claimed is:

1. An underwater sensor, comprising:
a nanomagnetic-based magnetometer unit (NMU) configured to output a field strength of a detected magnetic field (NMU data) caused by a submarine;
a transmit/receive communications unit (TRU) configured to transmit, at least, the NMU data;
an anchor/automated buoyancy system (ABS) configured to control a depth of the underwater sensor; and
a control unit configured to receive NMU data from the NMU, initiate communication thereof via the TRU, and control the ABS to adjust a depth of the underwater sensor,
wherein the NMU comprises a superparamagnet and the superparamagnet comprises a single molecule magnet.

2. The underwater sensor of claim 1, wherein the single molecule magnet is:

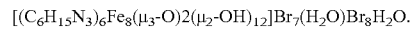

$[(C_6H_{15}N_3)_6Fe_8(\mu_3-O)2(\mu_2-OH)_{12}]Br_7(H_2O)Br_8H_2O.$

3. The underwater sensor of claim 1, wherein the TRU is further configured to transmit a unique identifier associated with the underwater sensor.

4. The underwater sensor of claim 1, wherein the TRU is further configured to transmit at least one of a timestamp, an indication of current depth and an indication of remaining power of a power supply.

5. The underwater sensor of claim 1, further comprising a solar cell configured to charge a rechargeable battery.

6. A system for magnetic anomaly detection (MAD), comprising:
- a plurality of underwater sensors, each sensor comprising:
  - a nanomagnetic-based magnetometer unit (NMU) configured to output a field strength of a detected magnetic field (NMU data) caused by a submarine;
  - a transmit/receive communications unit (TRU) configured to transmit, at least, the NMU data;
  - an anchor/automated buoyancy system (ABS) configured to control a depth of the underwater sensor; and
  - a control unit configured to receive NMU data from the NMU, initiate communication thereof via the TRU, and control the ABS to adjust a depth of the underwater sensor; and
- an underwater unmanned vehicle (UUV) configured to receive the NMU data from respective sensors and to determine a location of each respective sensor,
- wherein the NMU comprises a superparamagnet and the superparamagnet comprises a single molecule magnet.

7. The system of claim 6, wherein the plurality of sensors are connected to each other.

8. The system of claim 6, wherein the UUV further comprises a global positioning system (GPS) mast.

9. The system of claim 6, wherein the UUV is configured to determine the location of each respective sensor by ranging using synchronization signals.

10. The system of claim 6, wherein the TRU is configured to operate acoustically.

11. The system of claim 6, wherein the TRU is configured to operate electromagnetically.

12. A magnetic anomaly detection method, comprising:
- deploying a plurality of underwater magnetic field sensors in a field of operation, the magnetic field sensors being configured to output a field strength of a detected magnetic field caused by a submarine;
- obtaining a local position of each of the sensors;
- receiving magnetic field sensor data from each of the sensors, the magnetic field sensor data being indicative of a presence of a submarine; and
- generating a magnetic field anomaly map based on the magnetic field sensor data,
- wherein the magnetic field sensors comprise a superparamagnet and the superparamagnet comprises a single molecule magnet.

13. The method of claim 12, wherein the deploying step comprises deploying the underwater magnetic field sensors from an aircraft.

14. The method of claim 12, wherein the deploying step comprises deploying the underwater magnetic field sensors from at least one ship.

15. The method of claim 12, further comprising deploying an underwater unmanned vehicle (UUV) in the field of operations.

16. The method of claim 15, wherein the UUV performs the step of receiving magnetic field sensor data from each of the sensors.

17. The method of claim 16, further comprising receiving at the UUV magnetic field sensor data on a periodic basis.

18. The method of claim 16, further comprising receiving at the UUV magnetic field sensor data in response to a request from the UUV.

19. The method of claim 16, further comprising receiving at the UUV magnetic field sensor data only from a given underwater magnetic field sensors when that given underwater magnetic field sensors detects a change in its surrounding magnetic field.

20. The method of claim 12, further comprising remotely controlling a depth of each of the underwater magnetic field sensors.

21. The method of claim 20, further comprising controlling the underwater magnetic field sensors to rise to the surface to recharge a battery via a solar cell.

22. The method of claim 12, wherein the step of obtaining a local position of each of the sensors comprises performing ranging using synchronization signals from an associated underwater unmanned vehicle (UUV).

23. The method of claim 22, wherein the step of obtaining a local position of each of the sensors further comprises using global positioning system (GPS) coordinates of the UUV.

24. The method of claim 12, further comprising generating an alarm upon detection of a magnetic anomaly of a predetermined magnitude.

25. The method of claim 12, further comprising generating a baseline magnetic map.

26. The method of claim 25, further comprising comparing newly received magnetic sensor data to the baseline magnetic map.

\* \* \* \* \*

UNITED STATES PATENT AND TRADEMARK OFFICE
CERTIFICATE OF CORRECTION

| | | |
|---|---|---|
| PATENT NO. | : 8,054,070 B1 | Page 1 of 1 |
| APPLICATION NO. | : 12/328065 | |
| DATED | : November 8, 2011 | |
| INVENTOR(S) | : Marco Octavio Lanzagorta-Saldana | |

It is certified that error appears in the above-identified patent and that said Letters Patent is hereby corrected as shown below:

On the title page item (75) Inventor, replace "Mario Octavio Lanzagorta-Saldana" with
-- Marco Octavio Lanzagorta-Saldana --.

Signed and Sealed this
Twenty-first Day of February, 2012

David J. Kappos
*Director of the United States Patent and Trademark Office*